United States Patent [19]
Muto

[11] Patent Number: 4,907,861
[45] Date of Patent: Mar. 13, 1990

[54] THIN FILM TRANSISTOR, METHOD OF REPAIRING THE FILM TRANSISTOR AND DISPLAY APPARATUS HAVING THE THIN FILM TRANSISTOR

[75] Inventor: Ryujiro Muto, Fujisawa, Japan

[73] Assignee: Asahi Glass Company Ltd., Tokyo, Japan

[21] Appl. No.: 219,871

[22] Filed: Jul. 12, 1988

Related U.S. Application Data

[63] Continuation of Ser. No. 853,740, Apr. 18, 1986, abandoned.

[30] Foreign Application Priority Data

Apr. 23, 1985 [JP] Japan .................................. 60-85456

[51] Int. Cl.$^4$ .............................................. G02F 1/133
[52] U.S. Cl. ..................................... 350/336; 350/334; 350/339 R; 357/4
[58] Field of Search ........... 350/334, 336, 333, 339 R; 357/4, 30, 23.7, 32; 428/1

[56] References Cited

U.S. PATENT DOCUMENTS

| | | | |
|---|---|---|---|
| 3,584,183 | 6/1971 | Chiaretta | 357/4 |
| 3,699,395 | 10/1972 | Boleky | 357/4 |
| 3,834,794 | 9/1974 | Soref | 350/336 |
| 3,981,559 | 9/1976 | Channin | 350/336 |
| 4,272,775 | 6/1981 | Compton et al. | 357/4 |
| 4,306,246 | 12/1981 | Davies et al. | 357/36 |
| 4,448,491 | 5/1984 | Okubo | 350/333 |
| 4,563,806 | 1/1986 | Coissard | 29/571 |
| 4,644,338 | 2/1987 | Aoki et al. | 350/334 |

FOREIGN PATENT DOCUMENTS

| | | |
|---|---|---|
| 0126914 | 12/1984 | European Pat. Off. . |
| 2593631 | 7/1987 | France . |
| 5990958 | 5/1984 | Japan . |
| 60189969 | 9/1985 | Japan . |

OTHER PUBLICATIONS

IEEE Transactions on Electron Devices, Vol. ED-20, No. 11, Nov., 1973, pp. 995-1001, New York, U.S.T.P. Brody et al.: "A 6×6 Inch 20 Lines-Per-Inch Liquid-Crystal Display Panel".

Displays, Vol. 7, No. 1, Jan., 1986, pp. 37-39, Butterworth & Co., Ltd., Guildford, Surrey, GB; C. Hilsum et al., "Simplified Electrode Arrangement for TFT-Matrix Liquid Crystal Displays".

Matsuura et al., "LCD Panel Using Te TFT Array", Proceedings of the SID, Vol. 25, No. 1, 1984, pp. 17-20.

Powell et al., "Characteristics of Amorphous Silicon Staggered-Electrode Thin-Film Transistors", Applied Physics Letters Vol. 45, No. 2, July 15, 1984, pp. 171-173.

Primary Examiner—Bruce Y. Arnold
Assistant Examiner—Martin Lerner
Attorney, Agent, or Firm—Oblon, Spivak, McClelland, Maier & Neustadt

[57] ABSTRACT

A thin film transistor is connected to a picture element displaying electrode formed on an insulating base plate so that a voltage is applied to the electrode. The thin film transistor comprises a gate electrode, one or more drain electrodes connected to the picture element displaying electrode and a source bus line which applies a voltage to one or more source electrodes connected thereto, the source bus line functioning by itself as a source electrode, wherein the one drain electrode is formed between the source bus line and one of the one source electrode connected to the source bus line, or between the source electrodes adjacent to each other.

12 Claims, 6 Drawing Sheets

THIN FILM TRANSISTOR, METHOD OF REPAIRING THE FILM TRANSISTOR AND DISPLAY APPARATUS HAVING THE THIN FILM TRANSISTOR

This application is a Continuation of application Ser. No. 06/853,740, filed on Apr. 18, 1986, now abandoned.

The present invention relates to a thin film transistor for applying a voltage to a picture element displaying electrode for a picture displaying apparatus such as a liquid crystal type displaying apparatus.

Requirements of developing a thin display apparatus such as a terminal unit for an office automation apparatus, a plane television receiver and so on have increased. For instance, an active matrix type liquid crystal display apparatus in which electrodes are arranged in a parallel line pattern and active devices are disposed at each intersecting part of the electrodes to activate a liquid crystal, has widely been studied.

FIG. 16 is an equivalent circuit showing a typical active matrix type liquid crystal display apparatus. In FIG. 16, a reference numeral 28 designates a liquid crystal layer and a numeral 29 designates a capacitor which stores a potential applied to the liquid crystal layer. The capacitor 29 may be omitted. A numeral 30 designates a switching transistor for controlling a voltage for actuating the liquid crystal layer. Symbols $X_1$, $X_2$, $X_3$ ... designate selected data lines for controlling the gate of each of the switching transistors 30 and symbols $Y_1$, $Y_2$, $Y_3$ ... designate data lines for applying a voltage required to actuate the liquid crystal, the data line being driven for each line at a time.

On the other hand, the construction of the thin film transistor used as the switching transistor is classified into a coplanar structure type and a staggered structure type depending on a relation in position of a semiconductor layer, a gate electrode, a source electrode and a drain electrode. FIG. 17 is a cross-sectional view of the thin film transistor of the coplanar structure type; FIG. 18 is a cross-sectional view of the thin film transistor of the staggered structure type, and FIG. 19 is a plane view of the staggered structure type thin film transistor. In FIGS. 17 to 19, the same reference numerals designate the same structural elements of the thin film transistor. A reference numeral 1 designates an insulating base plate such as quartz, glass and so on, on which thin film transistors are formed. A numeral 2 designates a semiconductor layer made of polysilicon, amorphous silicon, CdSe and so on. Numerals 6, 10 respectively designate a source electrode and a drain electrode which usually have patterning by aluminum. A numeral 11 designates a gate insulator formed by, for instance, $SiO_2$, $Si_3N_4$. A numeral 12 designates a gate electrode having patterning by Al, Cr and so on. A numeral 31 designates a passivation film, a numeral 14 designates a contact hole, and a numeral 15 designates a picture element displaying electrode made of a transparent conductive film.

It is known a thin film transistor having a simplified pattern as shown in a plane view of FIG. 20. The thin film transistor as shown in FIG. 20 is prepared by forming source bus lines 4, 5, the drain electrode 10 and the picture element displaying electrode 15 by using the transparent conductive film followed by sequentially forming a semiconductor layer, an insulating film and the gate electrode 12 in a film form, and then, by etching the laminated body into a pattern of the gate electrode 12.

By arranging the thin film transistor having the above-mentioned structure for each picture elements, there is obtainable a high content information display apparatus having a high picture quality in comparison with a conventional apparatus having a panel formed by a dot matrix system. Thus, a high content liquid crystal display apparatus having a high picture quality can be obtained by using the thin film transistors.

In such display apparatus, a single picture element requires a thin film transistor. Accordingly, it is necessary to arrange 120 thousands thin film transistors on a single base plate to prepare a display panel having electrodes of 600 lines × 200 rows. It is very difficult to install a great number of thin film transistors without any fault.

In the transistors, there are many kinds of troubles of defects such as open circuit of a gate or a source, leakage between a gate and a source, leakage between a gate and a drain, leakage between a source and a drain, poor transistor property and so on.

The open circuit of the gate or the source derives from a scratch in the manufacturing steps and a defect of stepcoverage of the crossover portion of the transistor. These defects cause a non-activated line defect when the transistor is used in a liquid crystal cell. It is, however, possible that the transistor is repaired by connecting lead-out electrodes at both ends of a disconnected line.

On the other hand, the leakage between the gate and the source is resulted from dust entering in the insulator. Due to the leakage, a gate signal continuously escapes to a source line through a point of short circuit, and a voltage is always applied to the source thereby causing an activated line defect.

The leakage between the gate and the drain is resulted from the similar cause. In this case, a gate voltage is applied to the drain through a point of short circuit irrespective of presence of the source signal. In this case, an activated point defect also takes place. Further, when the transistor property is poor and application of a gate voltage do not pass a sufficient current, a source signal voltage is not applied to the transistor thereby causing a non-activated point defect in selecting operation.

The leakage between the source and the drain occurs due to presence of an extra pattern of etching of the source-drain electrode. In this case, a source signal is usually applied to the drain electrode to thereby cause an activated point defect.

In inspection of the defects of the thin film transistors by using a microscope, the defects are, in almost case, due to a foreign substance, a pin hole, an extra pattern of etching.

Occurrence of the defects depends on a manner of controlling of a process. Any line defect is not permissible in display elements. The point defect should be about 0.01% or smaller. However, in the base plate having 200 or more lines, there are a few line defects and the point defects in the range from 0.1% to 3%. Accordingly, productivity of the liquid crystal cell is low whereby practical use of the active matrix type picture display apparatus is hindered.

The number of defects can be reduced by reducing the number of processes for preparing the thin film transistor. The thin film transistor of a simplified pattern is produced by two masks as shown in FIG. 20, which effectively reduces occurrence of the defects. However, in the thin film transistor produced by the simplified process, a drain current undergoes influence of a switching transistor 30 and a stray transistor 32. The switching transistor 30 is formed by the n th source bus line 4 and the drain electrode 10 as shown in FIG. 20 The characteristics of the switching transistor 30 is determined by the channel width/the channel length = $W/L_1$ where the distance between the source bus line 4 and the drain electrode 10 is $L_1$ and the width of the gate electrode 12 is W. The stray transistor 32 is formed by the n+1 th source bus line 5 and the drain electrode 10 and the characteristics of the transistor 32 is determined by the channel width/the channel length = $W/L_2$ where the distance between the source bus line 5 and the drain electrode 10 is $L_2$. The intensity of the drain current caused by the stray transistor 32 depends on a designed value of the thin film transistor. Usually, it is about 5%-20% as large as a current value caused by the switching transistor. The value does not raise a big problem in a case of a binary display system. However, in a gradation display system, a signal flowing in the adjacent source line is picked up whereby a clear display can not be obtained.

Further, there was a problem that a current sufficient to activate the picture elements is not provided since the size of the transistor is small in comparison with the surface area of the picture elements.

It is an object of the present invention to eliminate the disadvantages of the conventional thin film transistor and to provide a thin film transistor which provides good productivity when a number of thin film transistors are formed on a single insulating base plate, has a simple structure without being subjected to influence of a stray transistor and other elements, and is capable of showing an excellent picture image when it is used for a picture display apparatus.

According to the present invention, there is provided a thin film transistor connected to a picture element displaying electrode formed on an insulating base plate so that a voltage is applied to the electrode, characterized by comprising a gate electrode, one or more drain electrodes connected to the picture element displaying electrode, and a source bus line which applies a voltage to one or more source electrodes connected thereto, wherein the one drain electrode is formed between the source bus line which functions by itself as a source electrode and the one source electrode connected to the source bus line, or between the source electrodes adjacent to each other, which are connected to the source bus line.

As an another aspect of the present invention, there is provided a method of repairing a thin film transistor connected to a picture element displaying electrode formed on an insulating base plate so that a voltage is applied to the electrode, wherein the thin film transistor comprising a gate electrode, at least two drain electrodes connected to the picture element displaying electrode, a source bus line, a plurality of source electrodes connected to the source bus line which applies a voltage to the source electrodes, and wherein the drain electrodes are formed between the source bus line which functions itself as a source electrode and one of the source electrodes, or between the source electrodes adjacent to each other, each of which is other than the source bus line as a source electrode, characterized in that a faulty portion of any electrode is separated from the source bus line or the picture element displaying electrode, and another set of the drain electrode and the source electrodes is connected to the source bus line and the picture element displaying electrode, if necessary.

As still another aspect of the present invention, there is provided a display apparatus comprising an insulating base plate on which a plurality of thin film transistors are formed to be connected to a picture element displaying electrode so that a voltage is applied to the electrode, and a liquid crystal contained between the base plate and electrode, characterized in that each of the thin film transistors comprises a gate electrode, one or more drain electrodes connected to the picture element displaying electrode, one or more source electrodes and a source bus line connected to the one or more source electrodes to apply a voltage to the source electrodes, wherein the drain electrode is interposed between the source bus line which functions by itself as a source electrode and the one source electrode connected to the source bus line, or between source electrodes adjacent to each other connected to the source bus line.

In the following, preferred embodiments of the thin film transistor according to the present invention will be described with reference to the drawings.

Figure 1:
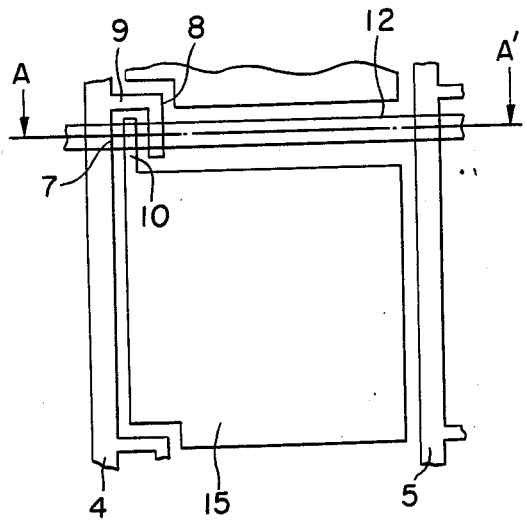
FIG. 1 is a plane view showing an embodiment of the thin film transistor according to the present invention.
Figure 2:
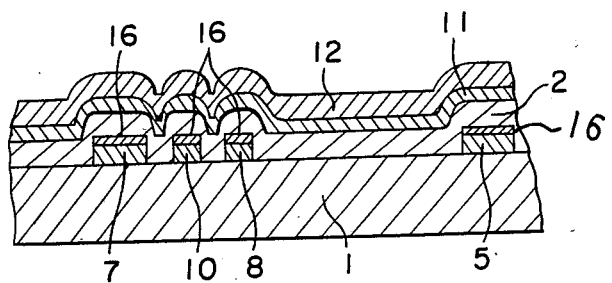
FIG. 2 is a cross-sectional view taken along a line AA' in FIG. 1.

FIG. 1 is a plane view showing the first embodiment of the present invention and FIG. 2 is a cross-sectional view taken along a line AA' in FIG. 1.

An insulating base plate is made of an insulating material such as quartz, glass and so on. An electrode of transparent conductive film made of, for instance, an indium-tin oxide (ITO) is formed on a surface of the base plate. n and P type semiconductor layers 16 which are respectively formed by doping an element such as P, As and so on or an element such as B and so on in a semiconductor material such as polysilicon, amorphous silicon, CdSe and so on is coated on the electrode.

The doped semiconductor layers 16 and the transparent electrode formed on the insulating base plate are simultaneously subjected to a patterning operation thereby to form a picture element display electrode 15 a source bus line 4, the second source electrode 8, a source connecting electrode 9 and a drain electrode 10 as shown in FIG. 1. In an area near the upper left corner portion of the picture element displaying electrode 15 in FIG. 1, there are formed the second source electrode 8 in substantially parallel to the source bus line 4 and the source connecting electrode 9 for connecting the second source electrode 8 to the source bus line 4. Also, at the upper left corner portion of the picture element displaying electrode 15, the drain electrode 10 is formed so that it extends between the source bus line 4 and the second source electrode 8.

A semiconductor layer 2 of a semiconductor material such as polysilicon, amorphous silicon, CdSe and so on, a gate insulator 11 made of a insulating material such as $SiO_2$, $Si_3N_4$, SiON and so on and a metallic layer used for a gate electrode which is made of a material such as Al, Cr and so on are sequentially formed on the base plate in this order. Then, the laminated body is subjected to sequentially etching operations of the metallic layer, the gate insulator and the semiconductor layer with a pattern of the gate electrode 12 as shown in FIG. 1, whereby the gate electrode 12, the gate insulator 11 and the semiconductor layer 2 are formed. Then, the doped semiconductor layer on the source bus line and other electrodes which are exposed in the area other than the gate electrode pattern is also removed by etching.

A portion between the source bus line 4 and the gate electrode 12 which spatially intersect with each other functions as the first source electrode 7.

Thus, a source signal is supplied to the drain electrode 10 from the first and second source electrodes 7, 8. Namely, the ratio of the channel width to the channel length of the thin film transistor having the above-mentioned construction is twice as much as the ratio of the conventional thin film transistor.

In this case, the drain electrode 10 is electrically isolated from the n+1 th source bus line 5 by means of the second source electrode 8. Accordingly, no stray transistor is formed with respect to the n+1 th source bus line 5, and only signal of the n th source bus line 4 is supplied to the picture element displaying electrode 15, whereby correct display can be obtained.

Figure 3:
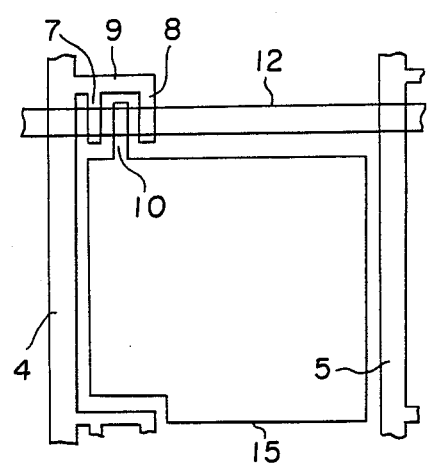
FIG. 3 is a plane view of another embodiment of the thin film transistor according to the present invention.

The source electrode may be formed in such a manner that as shown in FIG. 3, the first source electrode 7 is connected to the source connecting electrode 9 as well as the second source electrode 8. This construction is advantageous in that a defect in either source electrode is to be repaired.

Figure 5:
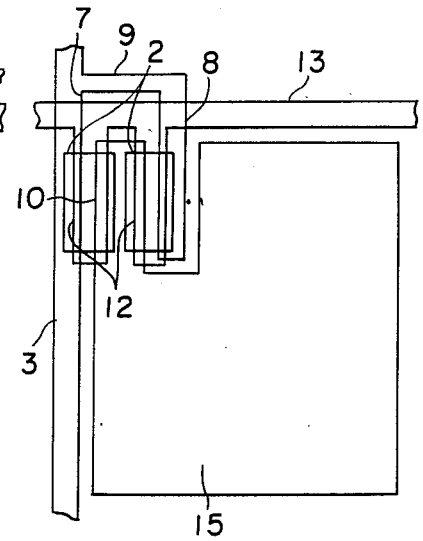
FIGS. 4 and 5 are respectively plane views showing the third and the fourth embodiments of the thin film transistor of the present invention.
Figure 4:
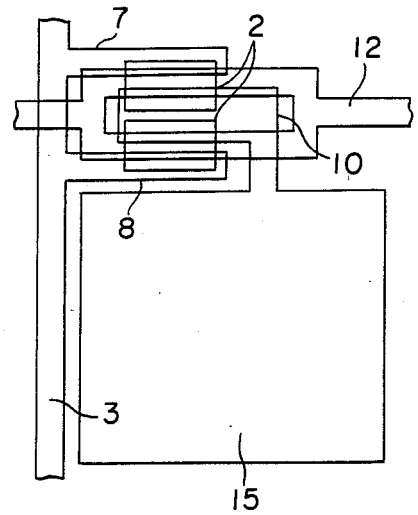

In the foregoing, description has been made as to the thin film transistor having a simplified pattern. However, the present invention is not limited to the thin film transistor having such pattern and structure, but is applicable to the conventional coplanar type or staggered type thin film transistor. For instance, a coplanar structure type thin film transistor may be formed as shown in FIG. 4. Namely, two source electrodes 7, 8 are extended at the right angle from the source bus line 3, and the drain electrode 10 is interposed between the source electrodes 7, 8. Alternatively, the coplanar structure type thin film transistor may be formed in such a manner that the drain electrode 10 is interposed between the source bus line 3 and the source electrode 8 extended in parallel to the source bus line 3 as shown in FIG. 5. In the coplanar structure type and staggered structure type thin film transistors, there is no influence by the stray transistor as is in the conventional thin film transistor having the simplified pattern. However, in the structure as shown in FIGS. 4 and 5 according to the present invention, there is an advantage that the ratio of the channel width to the channel length (W/L) of the thin film transistor is twice as much as that in the conventional transistor, and effective measures can be easily taken when there is a defect in the transistor.

In the following, description will be made as to a method of repairing of a defect in the thin film transistor when the defect is found. In extensive study of a great number of thin film transistors on the base plate, the inventors of the present application have found that positions where various defects may occur are indefinite in the base plate and possibility of occurrence defects in the neighbouring thin film transistors is extremely low. The present invention has been attained in view of the fact. Among the above-mentioned defects, a defect of the leakage between the source and the gate indicates the highest possibility. The leakage between the source and the gate invites a serious activated line defect which is the main cause of low productivity.

On the other hand, under the condition that a thin film transistor has good characteristics; a sufficient drain current can be obtained even in the structure having a small W/L ratio, and a leakage as shown by a numeral 17 exists in only one of two source-gate overlapping portions (FIGS. 6, 7 and 8), the source electrode 7 or 8, or the gate electrode 12 can be separated by any suitable way as shown by a numeral 18.

In this case, the drain electrode receives a source signal from the remaining source electrode 8 or 7. However, there is no problem with respect to binary data display as long as the thin film transistor has a sufficient capability. When the thin film transistor is used for gradation display, a color tone is somewhat different from the inherent color tone. However, the difference between them is not recognizable in a case of a moving picture and the value of a picture image is remarkably improved in comparison with that of the conventional thin film transistor having a line defect.

Figure 9:
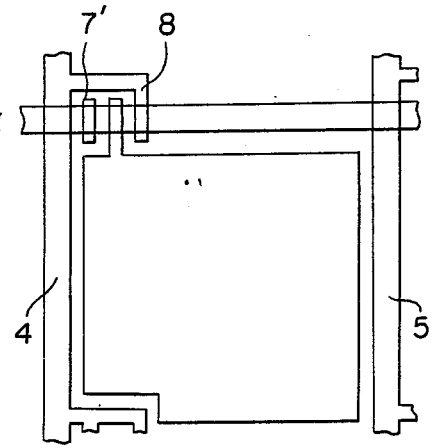
FIG. 9 is a plane view showing the fifth embodiment of the thin film transistor of the present invention.
Figure 10:
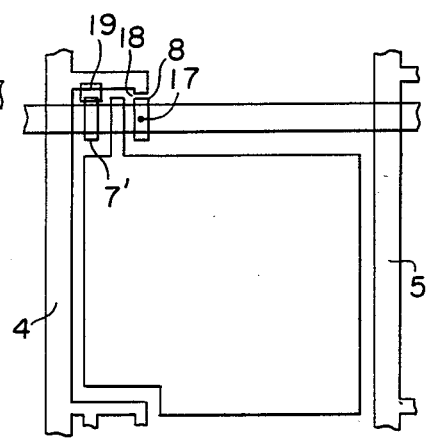
FIG. 10 is a plane view showing how to repair the defect of leakage between the source and the gate of the thin film transistor shown in FIG. 9.

FIG. 9 is a plane view of a modified embodiment of the thin film transistor having a simplified pattern in which two source electrodes 7', 8 are formed and the source electrode 7' is electrically separated from the source bus line 4. In this embodiment, when a defect of the leakage between the source and the gate as indicated by a numeral 17 in FIG. 10 is found by an inspection, the source electrode 8 of the thin film transistor is separated at its root portion 18, and the other source electrode 7' which is electrically separated is connected to the source connecting electrode at a portion indicated by a numeral 19 whereby the function of the transistor is recovered. In a case that the second source electrode 8 which is placed near the adjacent source bus line 5 is cut, the picture element repaired is subjected to influence of the stray transistor. However, it is difficult to discriminate the repaired picture elements which are scattered in a great number of picture elements. The repaired picture element has the same effect as described above.

The method of repairing the thin film transistor is applicable to the coplanar structure type and the staggered structure type.

In the next place, description will be made as to a thin film transistor of a simplified pattern having a plurality of drain electrodes.

Figure 11:
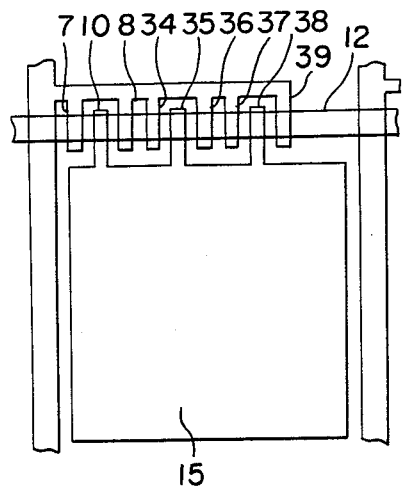
FIG. 11 is a plane view showing sixth embodiment of the thin film transistor of the present invention.

FIG. 11 shows the sixth embodiment of the present invention. The thin film transistor has a three drain electrodes 10, 35, 38, each of which is interposed between each pair of source electrodes 7, 8; 34, 36; 37, 39. When the performance of the thin film transistor is insufficient, it is effective to use a plurality of the thin film transistors having the structure as shown in FIG. 11. Namely, by arranging the plurality of the thin film transistors, the intensity of a drain current is multiplied by the number of transistors used. Thus, the drain current required to display can be obtained.

A method of repairing the thin film transistor having the above-mentioned structure will be described with reference to FIG. 12. When any defect is found in the thin film transistor, it is possible to repair the thin film transistor by cutting the drain electrode and/or the source electrode to electrically separate them. For instance, when a defect 17 of the leakage between the source and the gate in the source electrode 34 and a defect 20 of the leakage between the gate and the drain in the drain electrode 35 are found, the source electrode 34 and the drain electrode 35 are respectively cut at positions shown by numerals 18, 21 respectively. Namely, among three transistors, when one thin film transistor having the defect is separated, a drain current having the current intensity of two third is applied to the picture element displaying electrode 15. In this case, difference in display characteristic between the picture element having the defect electrode and other normal picture elements becomes small in comparison with the embodiment shown in FIG. 10, and a picture image having a high quality can be obtained.

Figure 13:
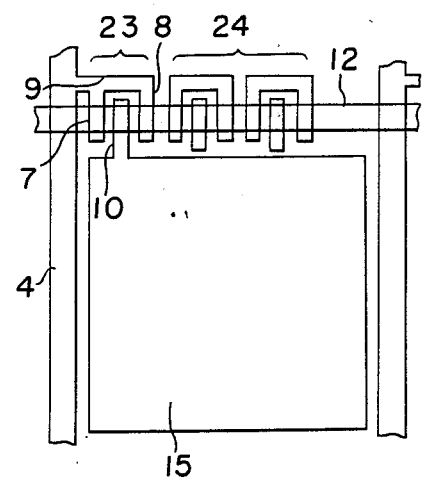
FIG. 13 is a plane view showing the seventh embodiment of the thin film transistor of the present invention.

FIG. 13 shows the seventh embodiment which is applicable to the thin film transistor under the condition that the performance of the transistor is sufficient. In FIG. 13, a plurality of thin film transistors are provided for a single picture element 15 in which a plurality of drain electrodes are placed between two source electrodes. Two thin film transistors 24 each having a pair of source electrodes and a drain electrode are electrically separated from the source bus line and the picture element displaying electrode 15. In more detail, the two thin film transistors 24 are auxiliary transistors which are electrically separated from each other and the other electrodes. When any defect is found in the main thin film transistor 23, the drain and/or source electrodes of the transistor 23 are cut at portions indicated by numeral 18, 21 so that these electrodes are electrically separated; the source electrodes of the auxiliary thin film transistor 26 which is near the main thin film transistor 23 and is in an electrically insulated state are connected to the source connecting electrode by a bridge member 25, and the drain electrode of the transistor 26 is connected to the picture element displaying electrode 15 by a bridge member 19 respectively; thus the thin film transistor 26 connected becomes operative.

In the thin film transistors having the above-mentioned structure, the drain current supplied to the picture element displaying electrode 15 is unchanged since the number of picture elements including normal picture elements and the repaired picture elements is unchanged. Further, the picture element displaying electrode 15 can receive a normal source signal. Accordingly, the display apparatus without no defect can be obtained.

In the present invention, the number of the thin film transistors is not limited to that in the above-mentioned embodiment. The number of the drain and source electrodes electrically separated is also not limited to the above-mentioned embodiment.

A method of cutting the electrodes to repair the thin film transistor may be any suitable method such as a method by using a laser trimmer, an ultrasonic cutter so on.

When the drain electrode of the second transistor is connected to the picture element displaying electrode, any suitable method can be utilized. For instance, a small conducting material is placed to the portion to be bridged by means of a dispenser, or a glass base plate coated with gold or alminum is placed on the thin film transistor base plate and a laser beam focused to be a predetermined size is irradiated under the atmospheric pressure or a reduced pressure from the side of the metal coated base plate so that a metal is coated on a desired portion of the thin film transistor base plate (the method being referred to as a laser coating method).

A liquid crystal display device is manufactured in such a manner that a base plate having thin film transistors produced or repaired as described above and another base plate with electrodes to be opposed to the base plate having transistors are prepared; an overcoat layer of a material such as polyimide, polyamide, silica, almina and so on is formed on the surface of the base plate with electrodes, followed by rubbing the surface to form an oriented film layer, if necessary; the two base plates are arranged so that their surfaces with the electrodes are opposed with a gap in the range of about 1 μm - about 20 μm; the peripheral parts of the two base plates are sealed; and then, a liquid crystal is enclosed between the base plates. In addition to the manufacturing steps as above-mentioned, it is possible to employ such a process, as in a conventional liquid crystal display apparatus, that a color filter layer or a light shielding layer is formed on or below the electrodes; a spacer member such as plastic balls, glass fibers, ceramic balls is interposed between the base plates to control the gap formed therebetween; a dichroic dye is mixed to the liquid crystal to effect color display; or a polarizer film, a reflecting film or an illumination means is disposed outside the liquid crystal display apparatus.

In the embodiments as shown in FIGS. 1 to 5, when a high voltage is applied to the gate electrode 12, a current flows into the drain electrode 10 through the first and second source electrodes 7, 8 connected to the source bus line 3 or 4 via the semiconductor layer 2 whereby the picture element displaying electrode 15 connected to the drain electrode 10 becomes the same potential as the source bus line 3 or 4. When the source bus line 3 or 4 is at a high potential, a voltage is applied across the picture element displaying electrode 15 and a common electrode (not shown). In a case of the liquid crystal display apparatus, a liquid crystal switch placed between the picture element displaying electrode 15 and the common electrode is turned on so that the picture element corresponding to the picture element displaying electrode 15 is operated for display.

When the source bus line 3 or 4 is at low electric potential, the picture element displaying electrode 15 is also maintained to be a low potential. Accordingly, the liquid crystal switch is not turned on and the picture element corresponding to the picture element displaying electrode 15 is in a non-operated condition.

While a selected potential is applied to other gate electrodes, a low potential is supplied to the gate electrode 12 which has received a signal so that the semiconductor layer 2 has a high resistance. Accordingly, the source electrodes 7, 8 are electrically separated from the drain electrode 10, and the liquid crystal switch for the picture element corresponding to the picture element displaying electrode 15 is kept in the original state due to the capacitance of the liquid crystal or an additional capacitance.

Figure 6:
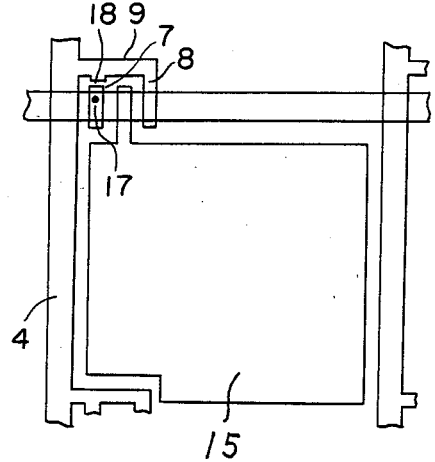
FIGS. 6, 7 and 8 are respectively plane views showing how to repair the defect of leakage between the source and the gate of the thin film transistor of the present invention.
Figure 7:
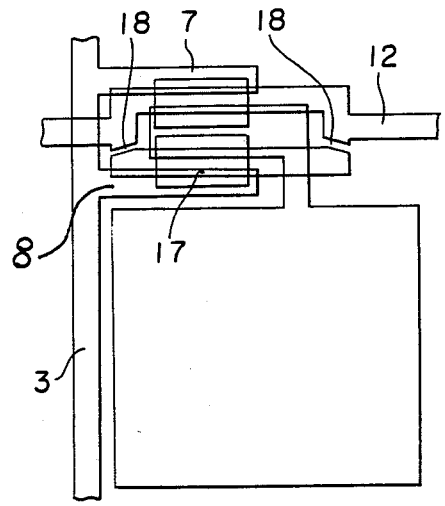
Figure 8:
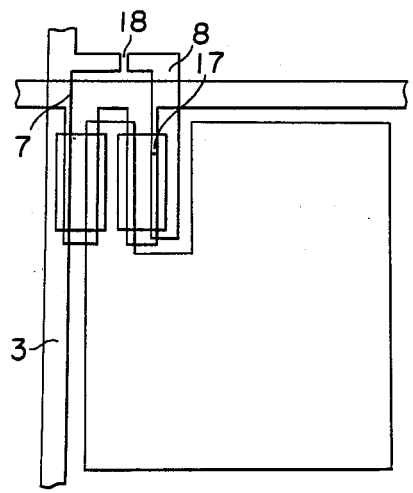

In the embodiments shown in FIGS. 1 to 5, the ratio of the channel width to the channel length (W/L) is large and the drain electrode 10 is electrically separated from the n+1 th source bus line 5 by means of the second source electrode 8. Accordingly, a sufficient drain current can be obtained. Further, there is no problem of formation of a stray transistor by the drain electrode 10 in association with the n+1 th source bus line 5. Thus, there is obtainable good switching operation. In a method of repairing the thin film transistor as shown in FIGS. 1 to 5, when a defect 17 of the leakage between the source and the gate as shown in FIGS. 6 to 8 takes place, the source electrode 7 or 8, and/or the gate electrode 12 are separated from the source bus line 3 or 4, or the gate bus line at the portion indicated by the reference numeral 18 to recover normal switching operation of the thin film transistor.

As shown in FIGS. 9 and 10, the same switching operation can be obtained even when only one source electrode 8 is connected to the source bus line 4. In this case, when a defect 17 of the leakage between the source and the gate takes place in the source electrode 8, the source electrode 8 is separated from the source bus line 4, and the auxiliary source electrode 7' is connected to the source bus line 4 so that normal switching operation is attained.

In the embodiment shown in FIG. 11, a sufficient drain current can be obtained and therefore excellent displaying effect is obtainable by providing a plurality of drain electrodes 10, 35, 38 and by interposing each of the drain electrodes between each pair of source electrodes 7, 8; 34, 36; and 37, 39.

Figure 12:
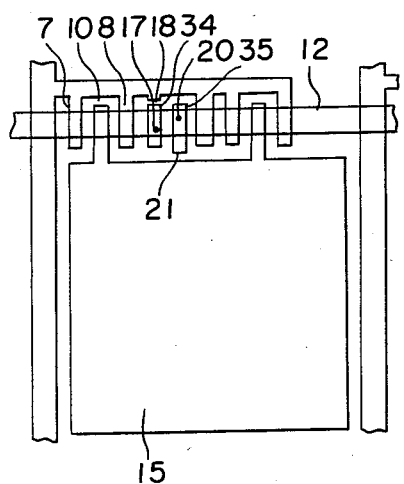
FIG. 12 is a plane view showing how to repair a faulty portion in the thin film transistor as shown in FIG. 11.

As shown in FIG. 12, defects of the leakage 17 between the source and the gate and/or the leakage 20 between the gate and the drain are found, the source electrode 34 and the drain electrode 35 having the defects are separated from the source bus line and the picture element displaying electrode at the portions indicated by the numerals 18, 21 to remove the defects.

In the embodiment shown in FIG. 13 in which two auxiliary thin film transistors 24 are provided, the same repairing method as in the foregoing embodiments can be employed. In this case, the same quantity of the drain current as that before repairing can be obtained and accordingly, a stable display effect can be obtained.

Thus, the thin film transistor of the present invention is so formed that when a defect is found in structural elements of a picture element for display, repairing can be made so as to apply a voltage from a source bus line inclusively used for the picture element. Accordingly, the thin film transistor capable of complete deletion or repair of the defects is obtainable. Accordingly, it is more effective than the conventional thin film transistor in which a voltage is applicable only from the adjacent source bus line when a defect is found.

In the following, examples of manufacturing and repairing of the thin film transistor according to the present invention will be described.

EXAMPLE 1

On a glass base plate of 50 mm square, indium-tin oxide layer of 1000 Å thick and $n_+$ amorphous silicon ($n^+$a-Si) of 500 Å were coated. Then, the source bus lines 4, 5, the source connecting electrodes 9, the source electrodes 8, the drain electrodes 10 and the picture element displaying electrodes 15 were formed in a predetermined pattern as shown in FIG. 1. The drain electrodes 10 were formed to be put between the source electrodes 7, 8.

Then, 2000 Å a-Si, 2000 Å SiON film were coated with P-CVD (plasma chemical vapor deposition) followed by coating aluminum layer of a thickness of 3000 Å to form gate electrodes. By using a photoresist method, the layers of aluminum, a-Si and SiON were etched with the pattern of the gate electrode 12. Then, the $n^+$a-Si layer on the ITO was etched to form thin film transistors for 200 × 200 picture elements.

In measuring the characteristics of the thin film transistors formed on the base plate, the value of the drain current is twice as much as that in the conventional thin film transistors having a simplified pattern. Further, the thin film transistor characteristics of a picture element was not influenced by a signal of an adjacent source bus line at all.

A liquid crystal display panel was assembled by coating an orientated film of polyimide on the base plate, and inspection of activation on the panel was carried out. In the gradation display operation, a clear and correct picture image could be obtained. There were found four activated line defects due to the leakage between the source and the gate and two activated point defects due to the leakage between the gate and the drain.

EXAMPLE 2

A thin film structure was prepared as in the same manner as in the Example 1 except that each of the drain electrodes 10 was interposed between each pair of source electrodes 7, 8 connected to each of the source connecting electrodes 9 as shown in FIG. 3. Inspection was carried out on the thin film transistors thus prepared. There were found three defects of the leakage between the source and the gate and only one defect of the leakage between the gate and the drain.

In observation of the thin film transistors having the three defects of the leakage between the source and the gate, black foreign substances were found at two intersecting portions in the gate electrode 12 and the first source electrode 7, and a intersecting portion in the gate electrode 12 and the second source electrode 8. The root portion of the source electrode having the foreign substance was cut by a laser trimmer as indicated by the reference numeral 18 in FIG. 6 to electrically separate the source electrode from the source connecting electrode 9 and the source bus line 4.

A liquid crystal display panel was prepared in the same manner as the Example 1, and inspection of activation was carried out. There was no activated point defect due to the leakage between the source and the gate, but only one defect of activated point defect due to, the leakage between the gate and the drain was found.

In careful observation of the repaired picture element at a close distance, the repaired picture element shows low contrast in comparison with other normal picture elements. However, when the repaired picture element is observed at a distance of 30 cm, difference between the repaired picture element and the other elements could not be recognized. Accordingly, it was understood that there was no problem as a picture element.

EXAMPLE 3

A thin film structure was prepared in the same manner as in the Example 1 except that as shown in FIG. 13, three thin film transistors were provided for each of the picture elements, each of the thin film transistors provided with the single drain electrode 10 interposed between the two source electrodes 7, 8 which were connected to the source connecting electrode 9; the source electrodes 7, 8 and the drain electrode 10 of the thin film transistor 23 nearest to the source bus line 4 were respectively connected to the source bus line 4 and the picture element displaying electrode 15, and the source and drain electrodes of the other thin film transistors 24 are in an electrically insulated state.

Figure 14:
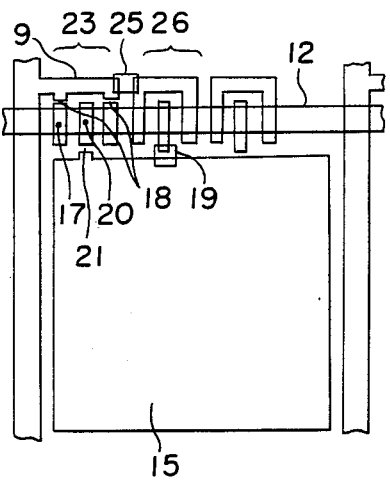
FIG. 14 is a plane view showing how to repair a faulty portion in the thin film transistor as shown in FIG. 13.

All the thin film transistors on the base plate were inspected. In the inspection, there were found three defects of the leakage between the source and the gate and two defects of the leakage between the gate and the drain. The source electrodes and the drain electrode having the defects were respectively cut as indicated by the reference numerals 18, 21 in FIG. 14 from the source connecting electrode 9 and the picture element displaying electrode 15 by using the laser trimmer. Then, the source connecting electrode and the drain electrode of the first auxiliary thin film transistor 26 which were electrically separated from any of the electrodes were respectively connected to the source connecting electrode 9 and the picture element displaying electrode 15. In the connecting operations, the laser trimmer was focused to the portions to be connected and glass base plates coated with gold to have a thickness of 5000 Å were placed on the thin film transistor base plate with the gold-coated surface facing the base plate, followed by irradiation of a laser beam under a reduced pressure. With the operations, gold on the glass base plates which was subjected to the irradiation of the laser beam was evaporated and deposited on the thin film transistor base plate as shown by the reference numerals 19, 25 in FIG. 14, and the source and drain electrodes of the first auxiliary thin film transistor 26 were connected to the source bus line and the picture element displaying electrode.

Figure 15:
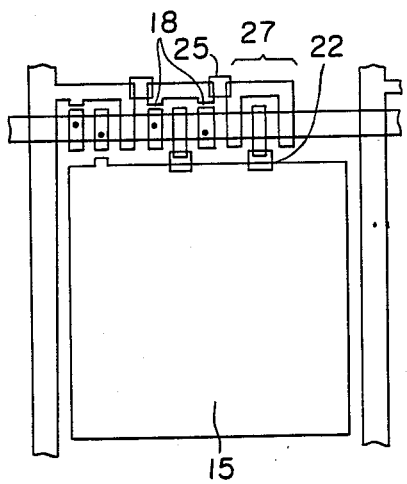
FIG. 15 is a plane view showing how to repair the thin film transistor of the present invention when a faulty portion has been further found in the repaired transistor.
Figure 16:
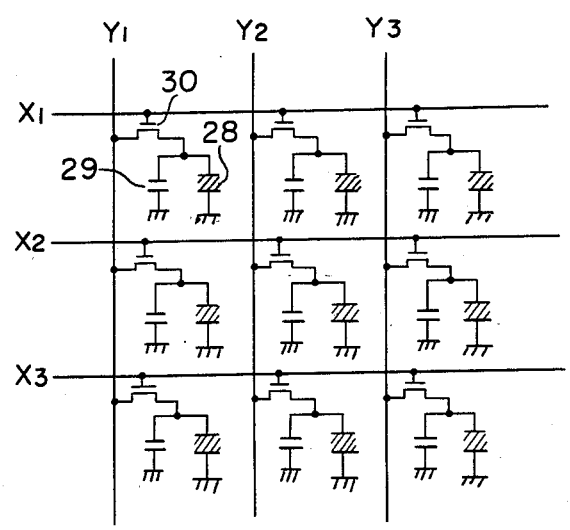
FIG. 16 is an equivalent circuit of a conventional active matrix type liquid crystal display apparatus.
Figure 17:
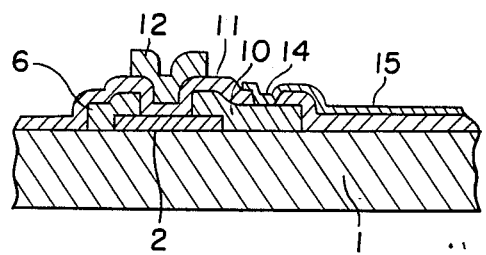
FIG. 17 is a cross-sectional view of a conventional coplanar type thin film transistor.
Figure 18:
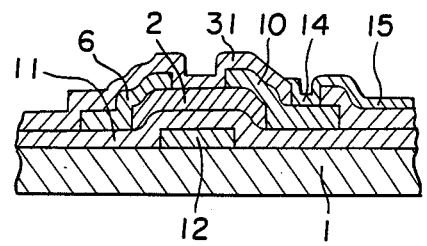
FIG. 18 is a cross-sectional view of a conventional inverted staggered type thin film transistor.
Figure 19:
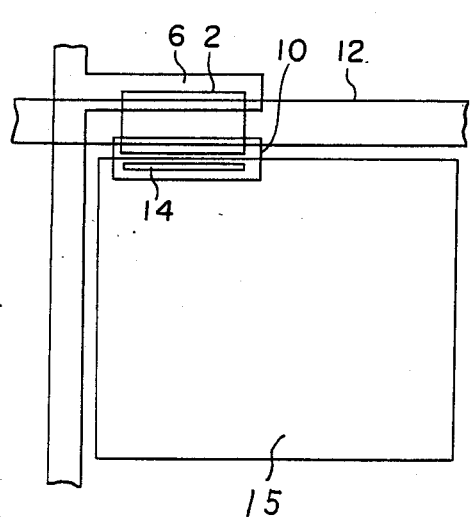
FIG. 19 is a plane view of the conventional inverted staggered type thin film transistor.
Figure 20:
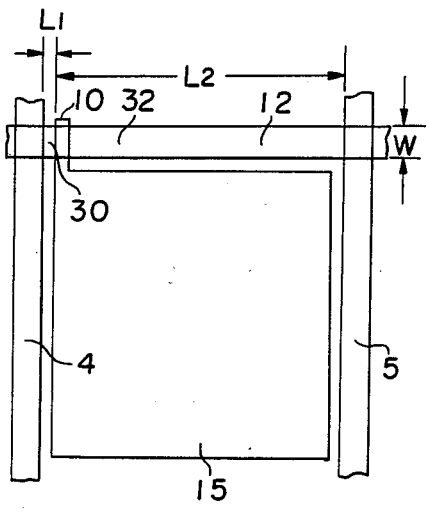
FIG. 20 is a plane view of a conventional thin film transistor having a simplified pattern.

The thin film transistors repaired were again subjected to inspection. The inspection revealed a defect of the leakage between the source and the gate of the first auxiliary thin film transistor 26. To remove the defect, the source electrode of the first auxiliary thin film transistor 26 was cut as shown by the reference numeral 18 in FIG. 15 by using the same method as described before, followed by connecting the source connecting electrode and the drain electrode of the second auxiliary thin film transistor 27 to the source connecting electrode of the first auxiliary thin film transistor 26 and the picture element displaying electrode 15 respectively as shown by the reference numerals 25, 22. As a result, a normal drain current was supplied to the picture element displaying electrode 15 from the second auxiliary thin film transistor 27.

A liquid crystal display panel was prepared by incorporating the repaired thin film transistors, and inspection of activation was carried out. No point defect and no line defect was recognized even by careful observation.

In the thin film transistor according to the present invention, a sufficient drain current can be provided by forming the drain electrode between the two source electrodes, and the drain electrodes is not influenced by the stray transistor at all.

By providing a plurality of thin film transistors, if the main thin film transistor is faulty, any of the auxiliary thin film transistors can be used to feed a correct source signal to the picture element displaying electrode. Accordingly, a thin film transistor base plate without defects can be prepared; productivity of the thin film transistor base plate is increased, at the cost for manufacturing a display apparatus can be reduced.

Further, after the repairing, a voltage can be applied to the picture element displaying electrode from the same source bus line which was used before repairing. Accordingly, the trace of repairing is not conspicuous.

In the present invention, by using the thin film transistor having the basic structure as shown in FIGS. 1 to 3, there is an advantage of good productivity since it is sufficient to use two masks, while there is no influence from an adjacent source bus line. Further, as shown in FIGS. 6, 9 to 14, the thin film transistor allows easy repairing even though there is a defect in the thin film transistor. As shown particularly in FIGS. 13 and 14, when a thin film transistor without electrical connection to the electrodes is formed and if a defect is found in the thin film transistor having connection to the electrodes, an auxiliary thin film transistor can be used whereby the picture element having the same level as the other normal picture elements can be obtained.

In the above-mentioned embodiments, the gate insulator may be made broader than the width of the gate electrode in order to avoid a problem such that side surfaces of the gate electrode and the source electrode or the drain electrode are damaged by spacers arranged in the liquid crystal cell to cause a short circuit. In this case, an additional mask is required. However, the number of the masks used in these type transistor is smaller than those used for the coplanar structure type or staggered structure type thin film transistor.

What is claimed is:

1. A thin film transistor connected to a picture element displaying electrode formed on an insulating base plate so that a voltage is applied to said electrode, comprising:
    a semiconductor layer;
    a gate electrode;
    a gate insulator formed between said semiconductor layer and gate electrode;
    one or more drain electrodes connected to said picture element displaying electrode; and
    a source bus line which applies a voltage to one or more source electrodes connected thereto;
    wherein said one or more drain electrodes are formed between said source bus line which functions by itself as a source electrode and said one source electrode connected to said source line, or between said source electrodes adjacent to each other, which are connected to said bus line and wherein said gate electrode is formed on said one or more source electrodes, said source bus line and said one or more drain electrodes all of which are formed on said insulating base plate, through a semiconductor layer and wherein said gate electrode, said gate insulator and said semi-conductor layer are all formed substantially in the same pattern and wherein the gate insulator is formed below the entire length of the gate electrode and the semiconductor layer is formed below the gate insulator.

2. A thin film transistor according to claim 1, wherein said one or more source electrodes, said source bus line, said one or more drain electrodes and said picture element displaying electrode on said insulating base plate are transparent electrodes.

3. A thin film transistor according to claim 1, wherein said one or more source electrodes are arranged in parallel to said one or more drain electrodes and a connecting electrode for said one or more source electrodes extend from said source bus line in parallel to said gate electrode.

4. A thin film transistor according to claim 3, wherein two or more drain electrodes are provided so that they are interposed between said source bus line and one of said one or more source electrodes are between said source electrodes adjacent to each other, and wherein all said drain electrodes are connected to said picture element displaying electrode and all said source electrodes are connected to said source bus line.

5. A thin film transistor according to claim 3, wherein two or more drain electrodes are provided so that they are interposed between said source bus line and one of said source electrodes or between said source electrodes adjacent to each other, and wherein either of said drain electrodes is connected to said picture element displaying electrode, which is interposed between said adjacent electrodes connected to said source bus line.

6. A display apparatus comprising:
an insulating base plate on which a plurality of thin film transistors are formed to be connected to a picture element displaying electrode so that a voltage is applied to said electrode, and a liquid crystal contained between said base plate and another base plate having an electrode, characterized in that each of said thin film transistors comprises:
a gate; a semiconductor layer; a gate insulator formed between said semiconductor layer and said gate electrode having the same pattern;
one or more drain electrodes connected to said picture element displaying electrode;
one or more source electrodes; and
a source bus line connected to said one or more source electrodes to apply a voltage to said source electrodes;
wherein said one or more drain electrodes are interposed between said source bus line which functions by itself as a source electrode and one of said source electrodes connected to said source line, or between source electrodes adjacent to each other connected to said source line and wherein said gate electrode is formed on said one or more source electrodes, said source bus line and said one or more drain electrodes, all of which are formed on said insulating base plate, through a semiconductor layer and wherein said gate electrode, said gate insulator and said semi-conductor layer are all formed substantially in the same pattern and wherein the gate insulator is formed below the entire length of the gate electrode and the semiconductor layer is formed below the gate insulator.

7. A display apparatus according to claim 6, wherein said one or more source electrodes, said source bus line, said one or more drain electrodes and said picture element displaying electrode on said insulating base plate are transparent electrodes.

8. A display apparatus according to claim 6, wherein said one or more source electrodes are arranged in parallel to said one or more drain electrodes and a connecting electrode for said one or more source electrodes extend from said source bus line in parallel to said gate electrode.

9. A display apparatus according to claim 8, wherein two or more drain electrodes are provided so that they are interposed between said source bus line and one of said one or more source electrodes or between said source electrodes adjacent to each other, and wherein one or more said drain electrodes are connected to said picture element displaying electrode and one or more said source electrodes are connected to said source bus line.

10. A display apparatus according to claim 8, wherein two or more drain electrodes are provided so that they are interposed between said source bus line and one of said source electrodes or between said source electrodes adjacent to each other, and wherein either of said drain electrodes is connected to said picture element displaying electrode, which is interposed between said adjacent electrodes connected to said source bus line.

11. A thin film transistor connected to a picture element displaying electrode formed on an insulating base plate so that a voltage is applied to said electrode, comprising:
a gate electrode;
one or more drain electrodes connected to said picture element displaying electrode;
a source bus line which applies to voltage to one or more source electrodes connected thereto, which are arranged in parallel to said one or more drain electrodes;
a connecting electrode for said one or more source electrodes situated in parallel to said gate electrode;
wherein said one drain electrode is formed between said source bus line which functions by itself as a source electrode and said one source electrode connected to said source bus line, or between said source electrodes adjacent to each other, which are connected to said source bus line; and
wherein two or more drain electrodes are provided so that they are interposed between said source bus line and one of said one or more source electrodes or between said source electrodes adjacent to each other, and wherein all of said drain electrodes are connected to said picture element displaying electrode and all said source electrodes are connected to said source bus line.

12. A display apparatus comprising an insulating base plate on which a plurality of this film transistors are formed to be connected to a picture element displaying electrode so that a voltage is applied to said electrode, and a liquid crystal contained between said base plate and another base plate having an electrode, wherein each of said thin film transistors comprises:

a gate electrode;

one or more drain electrodes connected to said picture element displaying electrode;

one or more source electrodes arranged in parallel with said one or more main electrodes and a source bus line connected to said one or more source electrodes to apply a voltage to said source electrodes;

wherein said one drain electrode is interposed between said source bus line which functions by itself as a source electrode and one of said source electrodes connected to said source bus line, or between source electrodes adjacent to each other connected to said source bus line; and further wherein two or more drain electrodes are provided such that they are interposed between said source bus line and one of said one or more source electrodes or between said source electrodes adjacent to each other, and wherein one or more said drain electrodes are connected to said picture element displaying electrode and one or more said source electrodes are connected to said source bus line.

* * * * *